(12) United States Patent
Ueda et al.

(10) Patent No.: US 7,236,067 B2
(45) Date of Patent: Jun. 26, 2007

(54) SURFACE ACOUSTIC WAVE FILTER

(75) Inventors: Masanori Ueda, Yokohama (JP);
Osamu Kawachi, Yokohama (JP);
Motoyuki Tajima, Yokohama (JP);
Kenya Hashimoto, Funabashi (JP);
Takuya Abe, Sagamihara (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 11/410,059

(22) Filed: Apr. 25, 2006

(65) Prior Publication Data
US 2006/0192636 A1    Aug. 31, 2006

Related U.S. Application Data

(60) Division of application No. 10/863,484, filed on Jun. 9, 2004, now Pat. No. 7,071,796, which is a continuation of application No. PCT/JP02/09039, filed on Sep. 5, 2002.

(30) Foreign Application Priority Data
Dec. 10, 2001  (JP) ............................. 2001-376422
Feb. 28, 2002  (JP) ............................. 2002-54593

(51) Int. Cl.
*H03H 9/64*     (2006.01)
(52) U.S. Cl. .................... 333/195; 333/196; 310/313 B
(58) Field of Classification Search ......... 333/193–196
See application file for complete search history.

(56) References Cited

U.S. PATENT DOCUMENTS

| | | | |
|---|---|---|---|
| 6,420,946 B1 | 7/2002 | Bauer et al. | |
| 6,483,402 B2 | 11/2002 | Endoh et al. | |
| 6,583,691 B2 | 6/2003 | Takamine | |
| 6,621,380 B2 | 9/2003 | Takamine | |
| 6,674,345 B2 * | 1/2004 | Nakamura et al. | 333/193 |
| 6,720,842 B2 | 4/2004 | Sawada | |
| 6,762,657 B2 | 7/2004 | Takamine | |
| 6,798,318 B1 | 9/2004 | Abbott et al. | |
| 6,853,269 B2 * | 2/2005 | Nakamura et al. | 333/193 |
| 2002/0017969 A1 | 2/2002 | Takamine | |
| 2004/0108918 A1 | 6/2004 | Tsunekawa et al. | |

FOREIGN PATENT DOCUMENTS

| | | |
|---|---|---|
| EP | 1 152 529 A2 * | 11/2001 |
| JP | 64-019815 | 1/1989 |
| JP | 9-321567 | * 12/1997 |
| WO | 00/25423 | 5/2000 |

* cited by examiner

*Primary Examiner*—Barbara Summons
(74) *Attorney, Agent, or Firm*—Arent Fox, LLP.

(57) ABSTRACT

A surface acoustic wave filter capable of obtaining a low insertion loss and wide bandwidth characteristic is provided. The surface acoustic wave filter includes a piezoelectric substrate; a pair of reflective electrodes formed on the piezoelectric substrate; and a plurality of comb electrodes formed between the pair of reflective electrodes on the piezoelectric substrate, wherein, in regard to the neighboring two comb electrodes among the plurality of comb electrodes, an electrode pitch of one comb electrode is set so that continuously varying phases of surface acoustic waves respectively generated by the two comb electrodes are obtained in a gap opposite to an outermost finger electrode of the other neighboring comb electrode.

12 Claims, 14 Drawing Sheets

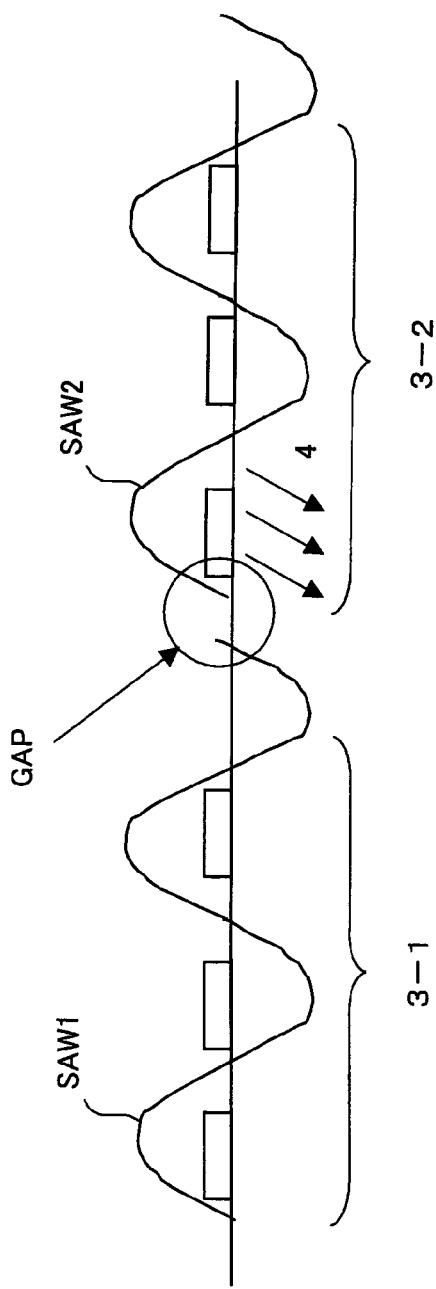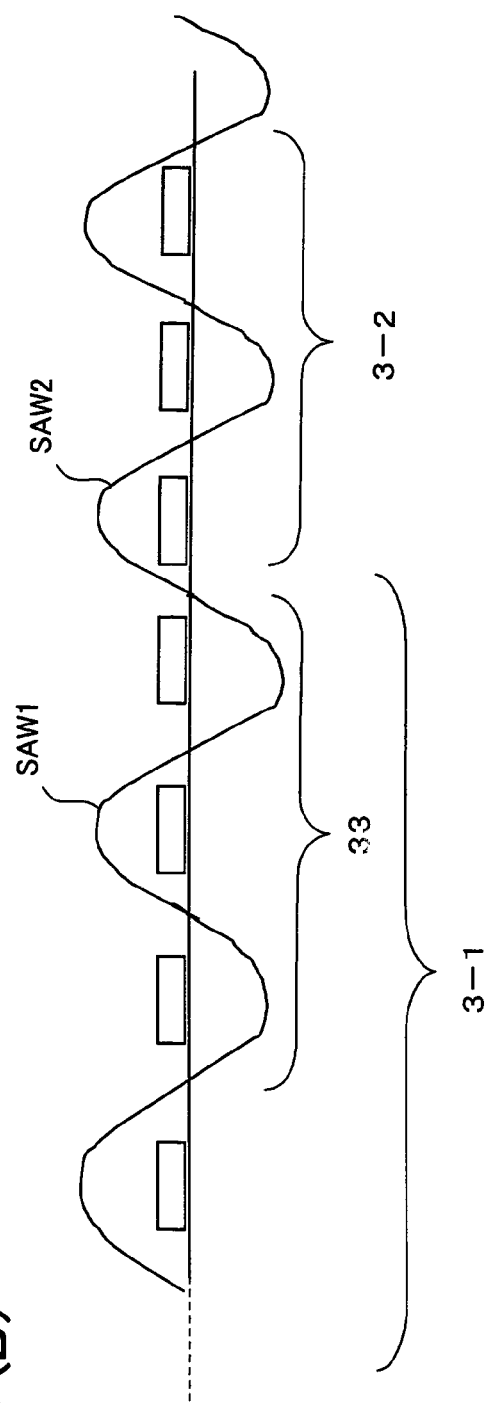

SURFACE ACOUSTIC WAVE FILTER

CROSS REFERENCE TO RELATED APPLICATION

This application is a divisional of prior application Ser. No. 10/863,484, filed Jun. 9, 2004, now U.S. Pat. No. 7,071,796; which is a continuation application of International Application No. PCT/JP02/09039, filed Sep. 5, 2002, which in turn claims priority of Japanese Patent Application No. 2001-376422, filed Dec. 10, 2001, and Japanese Patent Application No. 2002-54593, filed Feb. 28, 2002. The disclosures of these prior applications are hereby incorporated by reference herein in their entirety.

FIELD OF THE INVENTION

The present invention relates to a low insertion loss surface acoustic wave (SAW) filter having a wide bandwidth characteristics.

BACKGROUND ARTS

In recent years, use of a surface acoustic wave (SAW) filter has been spreading in a cellular phone, etc. for the purpose of suppressing undesired signals in transmission and reception, and the demand for the surface acoustic wave filter is increasing. For example, the surface acoustic wave filter is employed in a radio-frequency (RF) circuit section of the cellular phone. Such a surface acoustic wave filter is desired to have characteristics of low insertion loss and wide bandwidth.

FIG. 1 shows a plan view of an exemplary structure of a conventional surface acoustic wave filter. In FIG. 1, the surface acoustic wave filter has a pair of reflective electrodes 2-1, 2-2 on a piezoelectric substrate 1 formed of $LiTaO_3$, $LiNbO_3$, etc.

Also, a plurality of comb electrodes (three electrodes in the example shown in FIG. 1) 3-1, 3-2, 3-3 are structured between the pair of reflective electrodes 2-1, 2-2 on piezoelectric substrate 1. Each comb electrode 3-1, 3-2, 3-3 is constituted of a plurality of finger electrodes.

Among the plurality of finger electrodes constituting comb electrodes 3-1, 3-2, 3-3, finger electrodes are alternately grounded in common, and further, rest of the finger electrodes inserted between the above-mentioned grounded finger electrodes are connected in common to either an input end or an output end.

In the example shown in FIG. 1, alternate finger electrodes provided in the center comb electrode 3-2 are connected in common to an input end IN, while alternate finger electrodes provided in comb electrodes 3-1, 3-3 are connected in common to an output end. Here, each gap between the finger electrodes in comb electrodes 3-1, 3-2, 3-3 (hereafter referred to as electrode pitch) is the same in length.

Through a passband characteristic of the filter, a signal input to the input end IN is characterized, and then output to the output end OUT. At this time, caused by a surface acoustic wave, there are produced a first standing wave A having a resonant wavelength against the entire filter, and a second standing wave B having a resonant wavelength against each comb electrode 3-1, 3-2, 3-3, with an inverse polarity on comb electrode 3-2. Accordingly, in the example shown in FIG. 1, a multimode filter having two resonant modes is structured.

The passband characteristic is determined by the resonant characteristic obtained from the first standing wave A and the resonant characteristic obtained from the second standing wave B.

FIG. 2 shows a surface acoustic wave filter constituted of a plurality of sets of the filter structured of a unit shown in FIG. 1 connected in cascade. By constituting a filter in cascade connection as shown in FIG. 2, it becomes possible to obtain a sharper attenuation characteristic in the frequency band edge portions.

In FIG. 2, although piezoelectric substrate 1 is not shown, two pairs of reflective electrodes (2-1, 2-2), (2-3, 2-4) are structured on one piezoelectric substrate 1, and three comb electrodes (3-1, 3-2, 3-3), (3-4, 3-5, 3-6) are structured between each pair of the reflective electrodes.

This structure shown in FIG. 2 also constitutes a multimode filter having a plurality of resonant modes produced by the standing waves.

FIG. 3 shows an example of passband characteristic in such a multimode filter. In this figure, magnitude of attenuation is on the vertical axis, while frequency is on the horizontal axis. A range between the frequency in the lower zone and the frequency in the higher zone respectively having the magnitude of attenuation of 3 dB below the minimum attenuation value is referred to as a passband width.

As an ideal filter, it is desired to have a filter having a small minimum attenuation value with a wide passband width.

Here, as having been illustrated in FIG. 1, in comb electrodes 3-1, 3-2, 3-3, electrode pitches between the finger electrodes are entirely the same in length, and this is also applicable in comb electrodes 3-4, 3-5, 3-6 in the example shown in FIG. 2.

Further, in order to obtain a wider passband width in the filter characteristic, it has been necessary to set the gaps between the outermost finger electrodes of the respective comb electrodes 3-1 to 3-6, namely the gaps between neighboring comb electrodes, for example, comb electrode 3-1 and comb electrode 3-2, to lengths different from the finger electrode pitch. However, when each gap between the outermost finger electrodes of the comb electrodes is set to a length different from the finger electrode pitch, discontinuity is produced in the phase of a resonant wave at the gap, shown as GAP, between the outermost finger electrodes of the neighboring comb electrodes.

In FIG. 4, there is shown an enlarged diagram of the left portion, halved from the center of the center comb electrode 3-2 in the structure shown in FIG. 1. The right portion thereof is obtained by folding the structure shown in FIG. 4 to the right, which is omitted from the figure.

The lengths of the electrode pitches between the finger electrodes in both comb electrode 3-1 and comb electrode 3-2 are uniform. Further, in FIG. 4, a gap shown as GAP is produced between the outermost finger electrode of comb electrode 3-1 and the outermost finger electrode of comb electrode 3-2. When the gap size, GAP, is not equal to the electrode pitch in comb electrode 3-1 and comb electrode 3-2, discontinuity in phase is produced between the phase of a surface acoustic wave SAW1 on comb electrode 3-1 and the phase of a surface acoustic wave SAW2 on comb electrode 3-2.

This discontinuity in the phases of the surface acoustic waves is illustrated in FIG. 5, which is observed from the cross sectional direction of piezoelectric substrate 1. As shown in FIG. 5, in the gap shown as GAP, discontinuity is produced between the surface acoustic waves SAW1 and SAW2. This brings about producing a bulk wave radiation 4 passing through piezoelectric substrate 1.

This bulk wave radiation 4 becomes a major cause of the insertion loss in the surface acoustic wave filter. Therefore, it is necessary to maintain continuity in the phases of the surface acoustic waves.

As a method for maintaining continuity of the surface acoustic waves, there has been disclosed a technique in German Patent DE 42 12 517. In this technique, electrodes between neighboring comb electrodes are disposed based on a chirp function or a sine wave, and thereby a pseudo repetitive structure is inserted.

However, in general, insertion loss becomes larger as the gap size, GAP between neighboring comb electrodes is set larger. Therefore, it is not preferable that the gap size, GAP, between the neighboring comb electrodes is set large enough to insert such a pseudo repetitive structure as having been disclosed in the above-mentioned German Patent.

DISCLOSURE OF THE INVENTION

Accordingly, considering the aforementioned problem, it is an object of the present invention to provide a surface acoustic wave filter capable of obtaining a low insertion loss and wide bandwidth characteristic.

More specifically, it is also an object of the present invention to provide a surface acoustic wave filter, based on a prerequisite of a surface acoustic wave filter with the provision of at least one pair of reflective electrodes on a piezoelectric substrate, and an input comb electrode and an output comb electrode disposed between the reflective electrodes, thereby exciting a surface acoustic wave between the reflective electrodes, so as to obtain the surface acoustic wave filter having reduced insertion loss caused by discontinuity in the phases of the surface acoustic waves between the comb electrodes.

As a first aspect of the surface acoustic wave filter in accordance with the present invention to achieve the above-mentioned objects, the surface acoustic wave filter includes a piezoelectric substrate, a pair of reflective electrodes formed on the piezoelectric substrate, and a plurality of comb electrodes formed between the pair of reflective electrodes on the piezoelectric substrate. In regard to the neighboring two comb electrodes among the plurality of comb electrodes, an electrode pitch of one comb electrode is set so that continuously varying phases of surface acoustic waves respectively generated by the two comb electrodes are obtained in a gap opposite to an outermost finger electrode of the other neighboring comb electrode.

As a second aspect of the surface acoustic wave filter according to the present invention, the surface acoustic wave filter includes a piezoelectric substrate, and a plurality of unit sets of filters formed on the piezoelectric substrate, in which each set is connected to the other in cascade. Each plurality pair of filters includes a pair of reflective electrodes, and a plurality of comb electrodes formed between the pair of reflective electrodes on the piezoelectric substrate. In regard to the neighboring two comb electrodes among the plurality of comb electrodes, an electrode pitch of one comb electrode is set so that continuously varying phases of surface acoustic waves respectively generated by the two comb electrodes are obtained in a gap opposite to an outermost finger electrode of the other neighboring comb electrode.

As a third aspect of the surface acoustic wave filter according to the present invention, the surface acoustic wave filter includes a piezoelectric substrate, a pair of reflective electrodes formed on the piezoelectric substrate, and a plurality of comb electrodes formed between the pair of reflective electrodes on the piezoelectric substrate. In regard to the neighboring two comb electrodes among the plurality of comb electrodes, electrode pitches of the respective comb electrodes are set so that continuously varying phases of surface acoustic waves respectively generated by the two comb electrodes are obtained in a gap between outermost finger electrodes of the neighboring two comb electrodes.

As a fourth aspect of the surface acoustic wave filter according to the present invention, the surface acoustic wave filter includes a piezoelectric substrate, and a plurality of unit sets of filters formed on the piezoelectric substrate, in which each set is connected to the other in cascade. Each plurality pair of filters includes a pair of reflective electrodes, and a plurality of comb electrodes formed between the pair of reflective electrodes on the piezoelectric substrate. In regard to the neighboring two comb electrodes among the plurality of comb electrodes, electrode pitches of the respective comb electrodes are set so that continuously varying phases of surface acoustic waves respectively generated by the two comb electrodes are obtained in a gap between outermost finger electrodes of the neighboring two comb electrodes.

As a fifth aspect of the surface acoustic wave filter according to the present invention, in the first or the second aspect, one of the two neighboring comb electrodes is divided into a plurality of blocks, and the electrode pitch is set differently for each divided plurality of blocks.

As a sixth aspect of the surface acoustic wave filter according to the present invention, in the third or the fourth aspect, each of the two neighboring comb electrodes is divided into a plurality of blocks, and the electrode pitch is set differently for each divided plurality of blocks.

As a seventh aspect of the surface acoustic wave filter according to the present invention, in the first or the second aspect, different electrode pitches are set successively in one of the neighboring two comb electrodes.

As an eighth aspect of the surface acoustic wave filter according to the present invention, in the third or the fourth aspect, different electrode pitches are set successively in each of the neighboring two comb electrodes.

As a ninth aspect of the surface acoustic wave filter according to the present invention, in the first or the third aspect, the neighboring two comb electrodes are a comb electrode for input and a comb electrode for output, respectively.

As a tenth aspect of the surface acoustic wave filter according to the present invention, in the second or the fourth aspect, among the plurality of sets of filters connected in cascade, one of the neighboring two comb electrodes disposed in the first stage of the filter set is a comb electrode for input, and one of the neighboring two comb electrodes disposed in the final stage of the filter set is a comb electrode for output.

As an eleventh aspect of the surface acoustic wave filter according to the present invention, the surface acoustic wave filter includes a piezoelectric substrate, a surface acoustic wave resonator formed on the piezoelectric substrate, and a multimode filter which is formed on the piezoelectric substrate and connected in series with the surface acoustic wave resonator. The multimode filter includes a pair of reflective electrodes, and a plurality of comb electrodes formed between the pair of reflective electrodes on the piezoelectric substrate. In regard to the neighboring two comb electrodes among the plurality of comb electrodes, an electrode pitch of one comb electrode is set so that continuously varying phases of surface acoustic waves respectively generated by the two comb electrodes are obtained in a gap opposite to an outermost finger electrode of the other neighboring comb electrode.

As a twelfth aspect of the surface acoustic wave filter according to the present invention, the surface acoustic wave filter includes a piezoelectric substrate, a surface acoustic wave resonator formed on the piezoelectric substrate, and a first multimode filter and a second multimode filter each formed on the piezoelectric substrate and connected in series with the surface acoustic wave resonator. Each multimode filter includes a pair of reflective electrodes, and a plurality of comb electrodes formed between the pair of reflective electrodes on the piezoelectric substrate. In regard to the neighboring two comb electrodes among the plurality of comb electrodes, an electrode pitch of one comb electrode is set so that continuously varying phases of surface acoustic waves respectively generated by the two comb electrodes are obtained in a gap opposite to an outermost finger electrode of the other neighboring comb electrode.

As a thirteenth aspect of the surface acoustic wave filter according to the present invention, in the eleventh or the twelfth aspect, a second surface acoustic wave resonator is additionally connected in parallel with the surface acoustic wave resonator.

As a fourteenth aspect of the surface acoustic wave filter according to the present invention, in the twelfth aspect, the surface acoustic wave resonator is connected to an unbalanced input end or an unbalanced output end, and terminals in the first multimode filter and the second multimode filter are connected to corresponding balanced output ends or balanced input ends.

Further scopes and features of the present invention will become more apparent by the following description of the embodiments with the accompanying drawings.

BRIEF DESCRIPTION OF THE DRAWINGS

FIG. 7 shows diagrams thereby illustrating that a continuous surface acoustic wave phase is obtained in a gap to an outermost finger electrode 322 disposed in comb electrode 3-1, in the embodiment shown in FIG. 6.

DETAILED DESCRIPTION OF THE PREFERRED EMBODIMENTS

Figure 4:
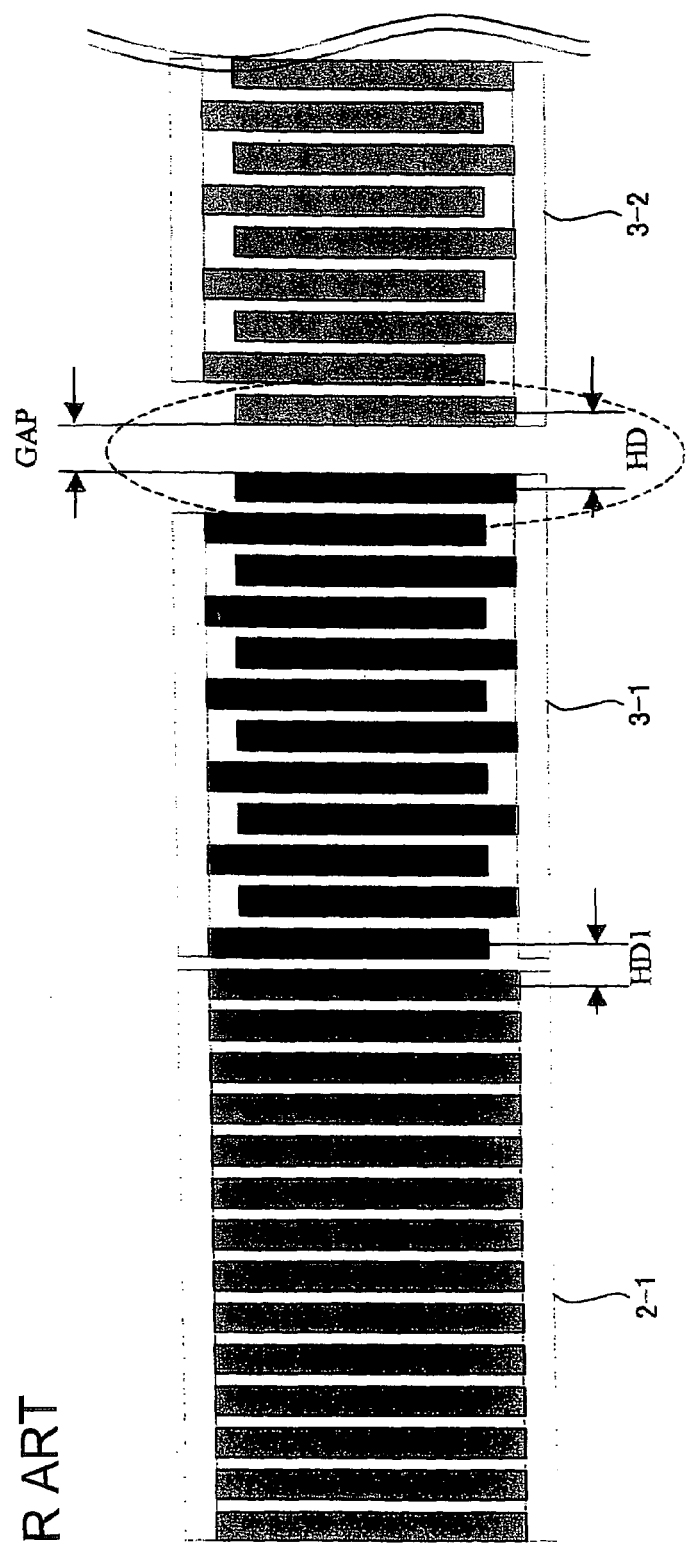
FIG. 4 shows a diagram illustrating the left portion of the center comb electrode 3-2 halved at the center of the structure of the comb electrode shown in FIG. 1.
Figure 6:
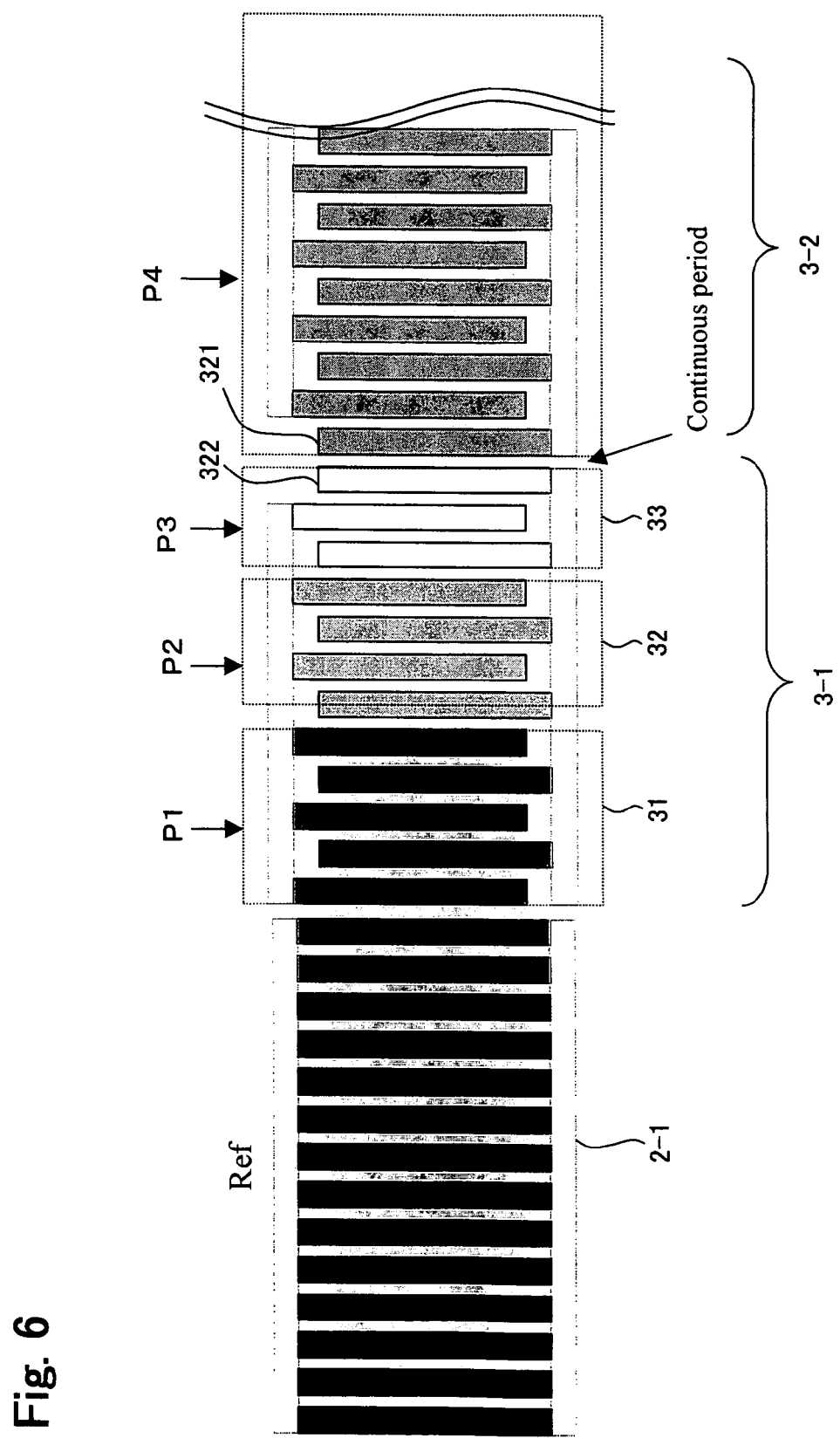
FIG. 6 shows a first embodiment of the present invention, illustrating only the electrode structure without illustrating piezoelectric substrate 1, similarly to FIG. 4.

FIG. 6 shows a first embodiment of the present invention illustrating a plan view of an electrode structure only, omitting piezoelectric substrate 1 in the same way as FIG. 4. The way of above illustration is applied in the following description of other embodiments. Further, in FIG. 6, there is shown an enlarged view of the left portion halved at the center of the center comb electrode 3-2, in the same way as shown in FIG. 4.

In addition, as an embodiment, a leaky surface acoustic wave is used in the surface acoustic wave filter shown in FIG. 6.

A feature of the embodiment shown in FIG. 6 is that comb electrode 3-1 neighboring comb electrode 3-2 (as for the structure of the right half portion, the above comb electrode 3-1 is to be replaced by comb electrode 3-3) is divided into a plurality of blocks. In the example shown in FIG. 6, comb electrode 3-1 is divided into three blocks 31, 32 and 33.

Further, the three blocks 31, 32, 33 are structured with electrode pitches P1, P2, P3, respectively, which are different step-by-step. With this structure, it becomes possible to obtain a continuous phase of the surface acoustic wave in the gap between the outermost finger electrode 321 of comb electrode 3-2 and the outermost finger electrode 322 of comb electrode 3-1.

Figure 5:
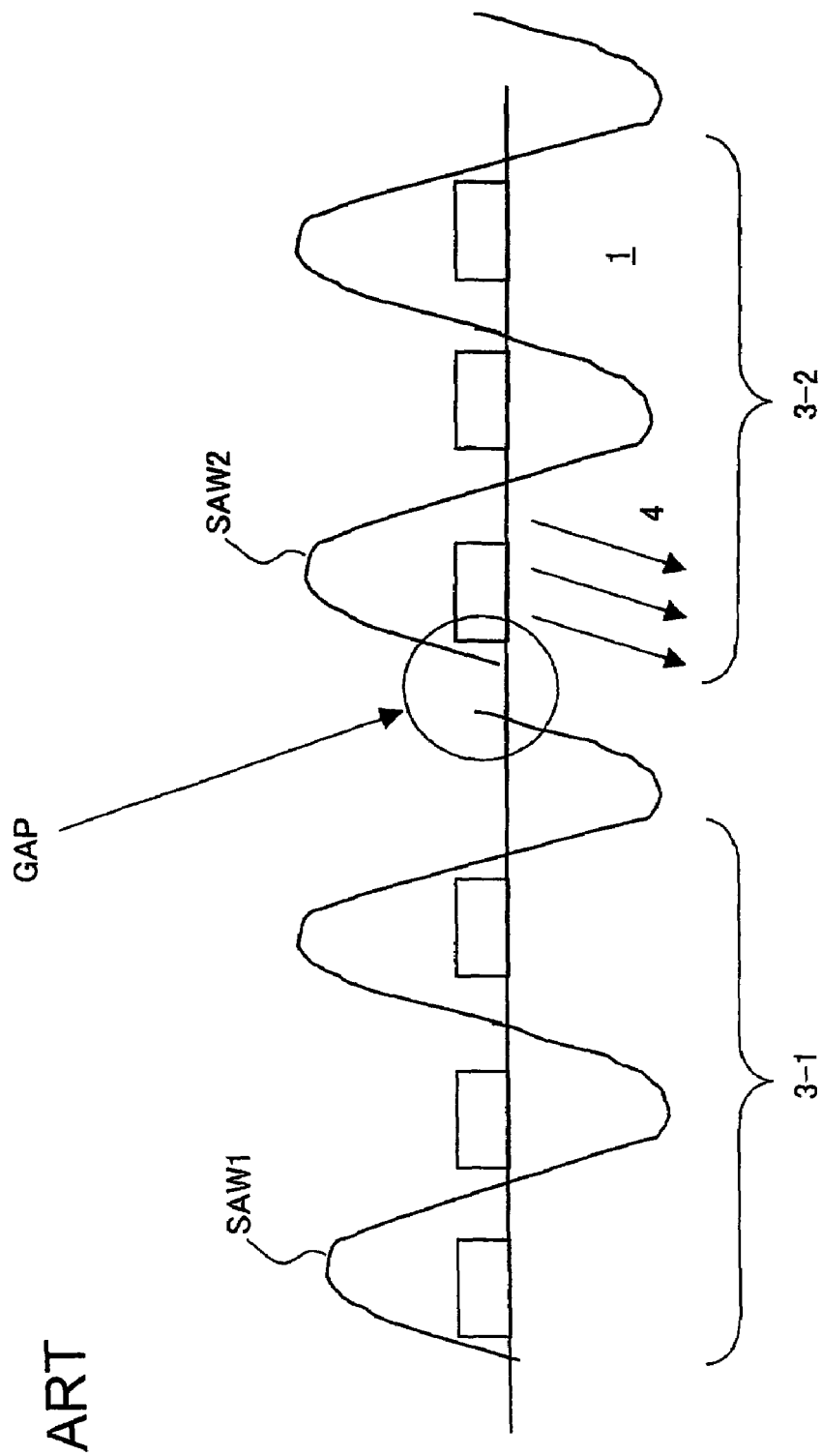
FIG. 5 shows a diagram illustrating discontinuity of the surface acoustic wave phases observed from the cross-sectional direction of piezoelectric substrate 1.

The above-mentioned aspect is shown in FIG. 7. FIG. 7 (A) is a diagram in which FIG. 5 is repeatedly shown. Discontinuity in phase is being produced between the surface acoustic wave SAW1 on comb electrode 3-1 and the surface acoustic wave SAW2 on comb electrode 3-2. FIG. 7 (B) is a diagram according to the embodiment of the present invention, in which the gap opposite to an outermost finger electrode of comb electrode 3-2 is adjusted by the electrode pitch of block 33, that is, one of the plurality of divided blocks in the comb electrode 3-1.

With the above-mentioned method, it becomes possible to obtain a continuous phase of the surface acoustic waves between the surface acoustic wave SAW1 in block 33 of comb electrode 3-1 and the surface acoustic wave SAW2 on comb electrode 3-2, and thereby bulk wave radiation can be prevented from passing through the piezoelectric substrate.

Figure 8:
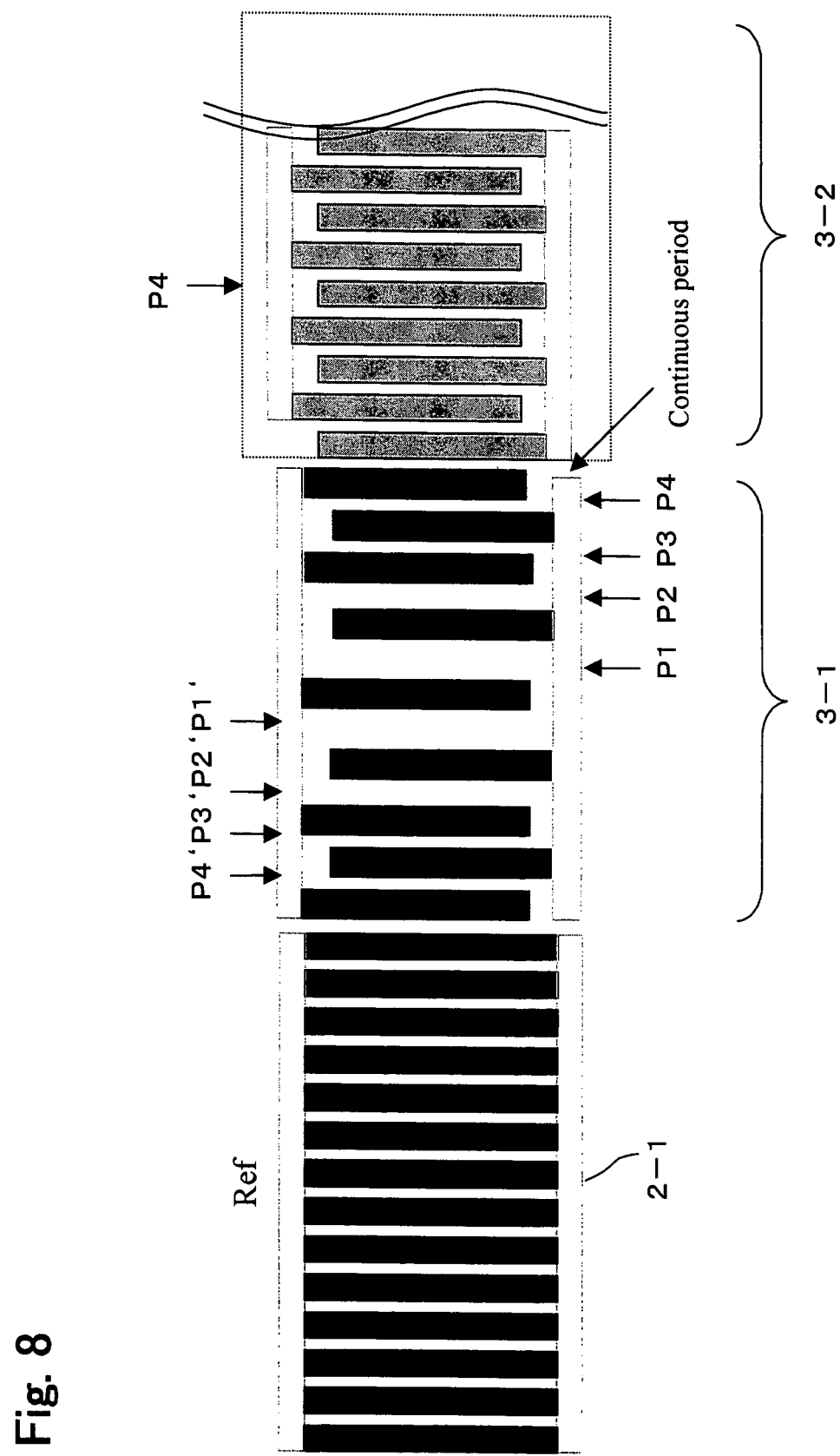
FIG. 8 shows a second embodiment of the present invention.

FIG. 8 shows a second embodiment of the present invention. In this embodiment, comb electrode 3-1 is so structured as to have different pitches step-by-step, enabling to obtain a continuous wave phase between the finger electrodes in the ends of comb electrodes 3-1, 3-2.

In particular, in FIG. 8, the electrode pitches are adjusted in the both direction from the center of comb electrode 3-1, so as to satisfy relations of, for example, $P4<P3<P2<P1=P1'>P2'>P3'>P4'$, thereby enabling a continuous surface acoustic wave phase between comb electrode 3-2 and reflective electrode 2-1.

Figure 9:
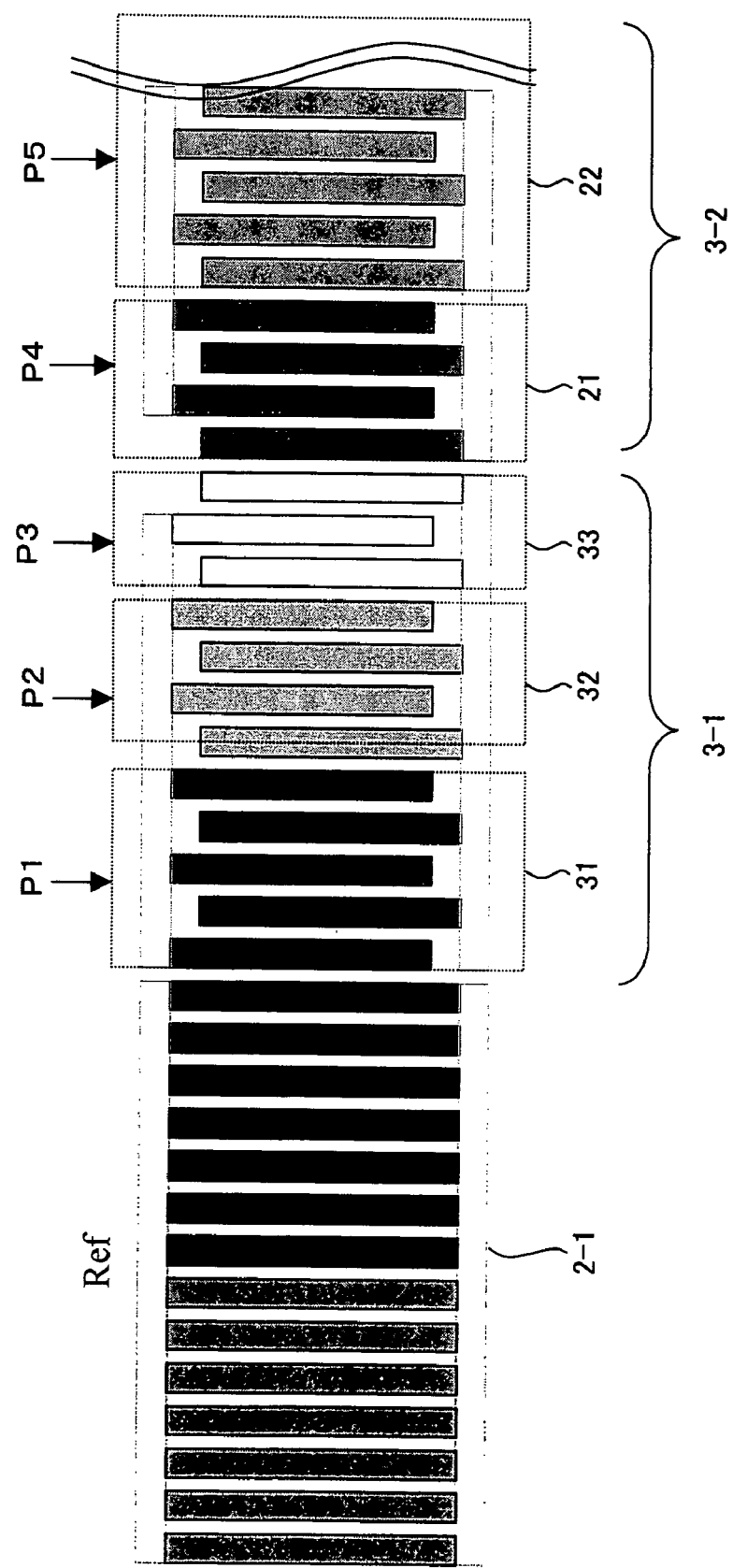
FIG. 9 shows still another embodiment of the present invention.

FIG. 9 shows still another embodiment of the present invention. In the foregoing embodiments, the electrode pitches have been adjusted in comb electrode 3-1, as well as in comb electrode 3-3 in the non-illustrated right portion, to obtain a continuous surface acoustic wave phase between comb electrode 3-1 (3-3) and the neighboring center comb electrode 3-2.

In contrast, in the embodiment shown in FIG. 9, the electrode pitches in comb electrode 3-2 are also adjusted. This enables easy adjustment of the electrode pitch, as compared to the method of adjusting the pitch in comb electrode 3-1 (3-3) only.

According to this embodiment, comb electrode 3-1 is divided into three blocks 31, 32, and 33, having electrode pitches P1, P2 and P3, respectively. Meanwhile, comb electrode 3-2 is divided into three blocks 21, 22 and 23 (here, block 23 is a block in the non-illustrated right portion of comb electrode 3-2, correspondingly to block 21). The electrode pitches of the three blocks 21, 22, 23 in comb electrode 3-2 are P4, P5, P6, respectively. Here, block 23 and the right half of block 22 in comb electrode 3-2 are not shown in FIG. 9.

As an embodiment example, the ratios of these electrode pitches P1, P2, P3, P4, P5 are set to satisfy the following relations, assuming the electrode pitch P5 of the center block 22 in comb electrode 3-2 has a reference value '1'.

P1=0.9976
P2=0.9669
P3=0.8986
P4=0.9375
P5=1

Figure 2:
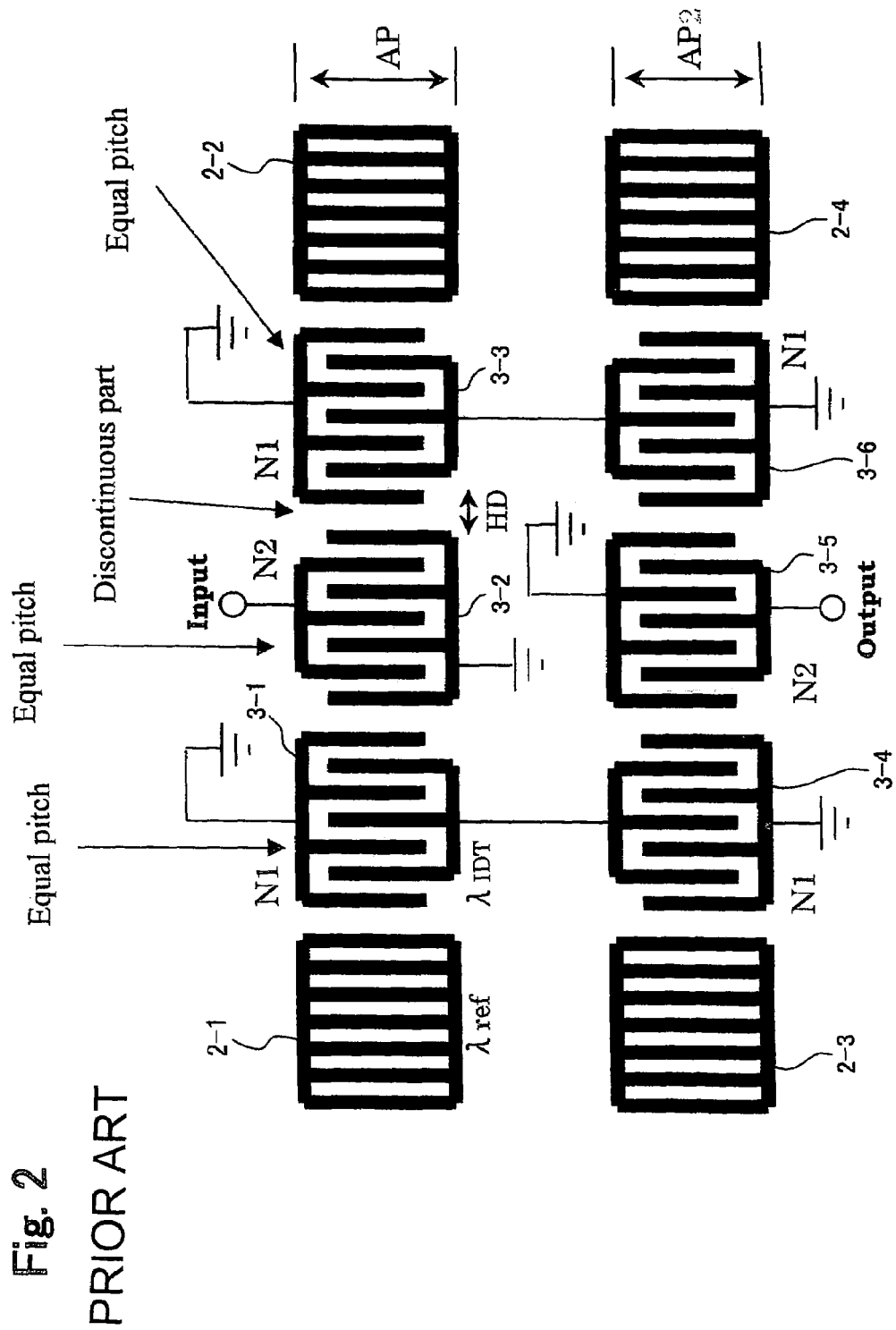
FIG. 2 shows a surface acoustic wave filter structured of the filters having the structure shown in FIG. 1 connected in cascade.
Figure 3:
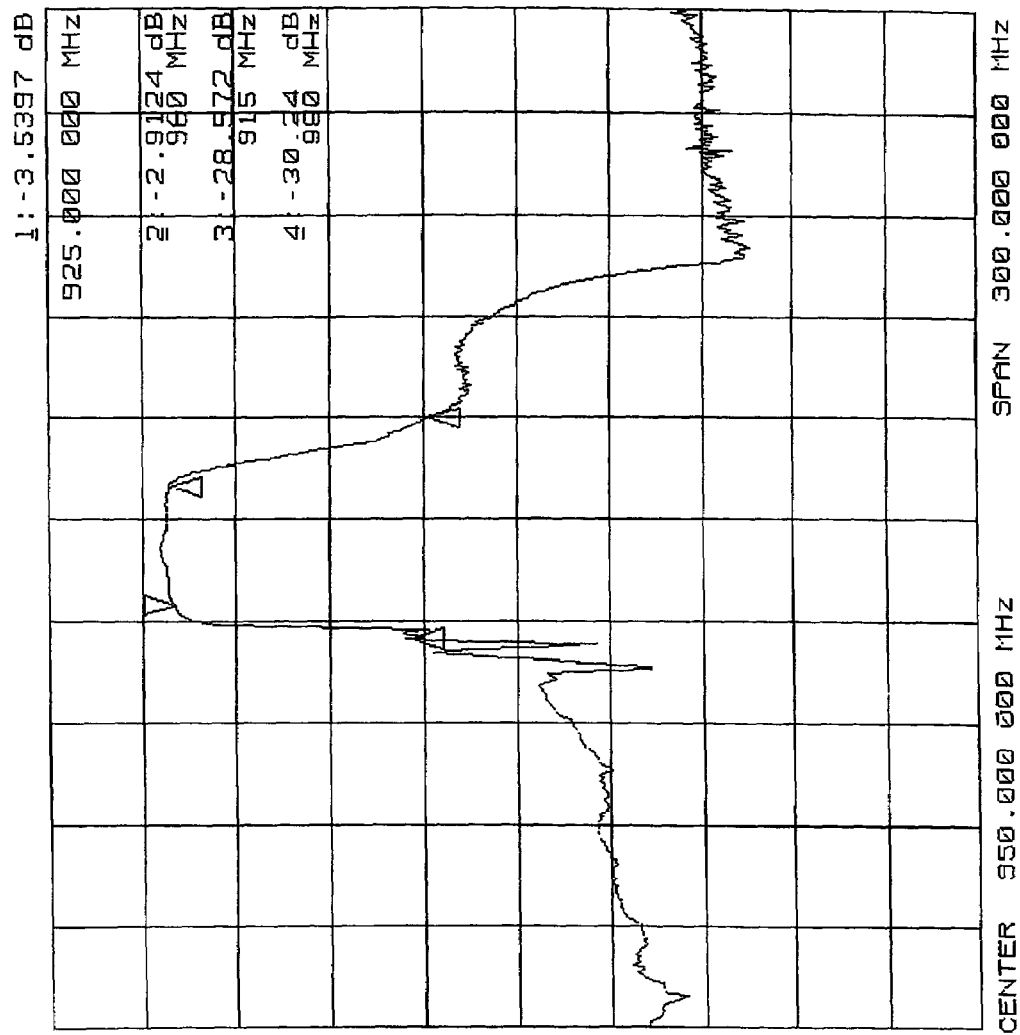
FIG. 3 shows a diagram illustrating an example of passband characteristic obtained in a multimode filter.
Figure 10:
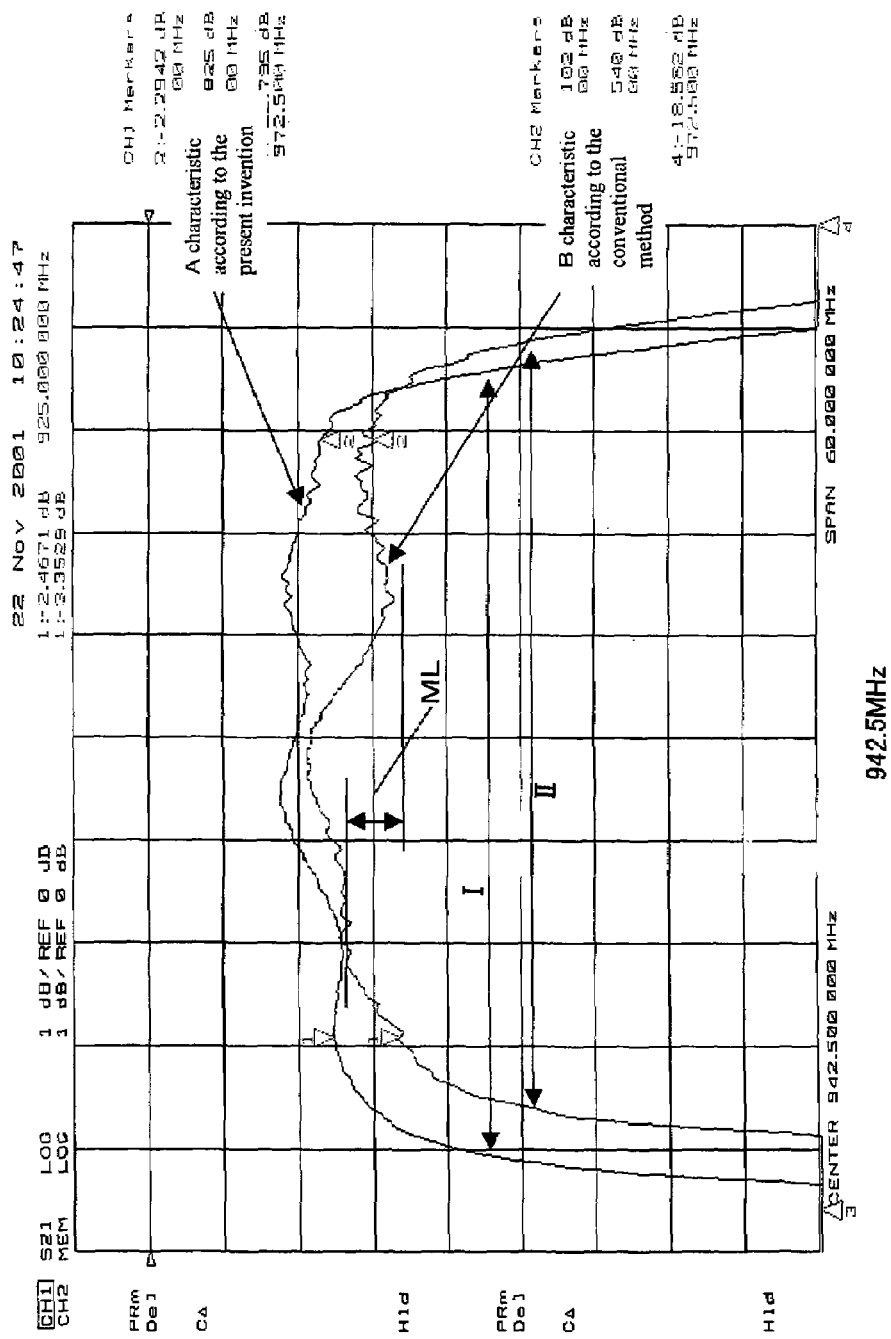
FIG. 10 shows a diagram illustrating a measured passband characteristic of an embodiment having two-stage cascade connection in the embodiment shown in FIG. 9.

FIG. 10 shows a diagram illustrating a passband characteristic of the embodiment shown in FIG. 9 measured against a surface acoustic wave filter which has the electrode pitches P1, P2, P3, P4, P5 set under the relations described above, using the electrode pitch P5 as a reference, and is structured of two stages of cascade connection, as shown in FIG. 2.

In FIG. 10, a characteristic A is a passband characteristic of the surface acoustic wave filter according to the present invention, while a characteristic B is a passband characteristic of the conventional surface acoustic wave filter without adjustment of the electrode pitches.

As a comparison result using FIG. 10, in the characteristic A of the surface acoustic wave filter according to the present invention, an improvement of approximately 1 dB (ML) has been obtained in the insertion loss, as compared to the characteristic B of the conventional surface acoustic wave filter without adjusted electrode pitches. Further, it is to be understood that the passband width I of the surface acoustic wave filter according to the present invention has a wider bandwidth than the passband width II of the conventional surface acoustic wave filter.

Here, in each above-mentioned embodiment of the present invention, a case of three comb electrodes has been shown for a plurality of comb electrodes. However, when applying the present invention, it is not limited to the above-mentioned case. The present invention may be applicable to a surface acoustic wave filter structured of one comb electrode for input and one comb electrode for output, or a surface acoustic wave filter having more than three comb electrodes.

Figure 1:
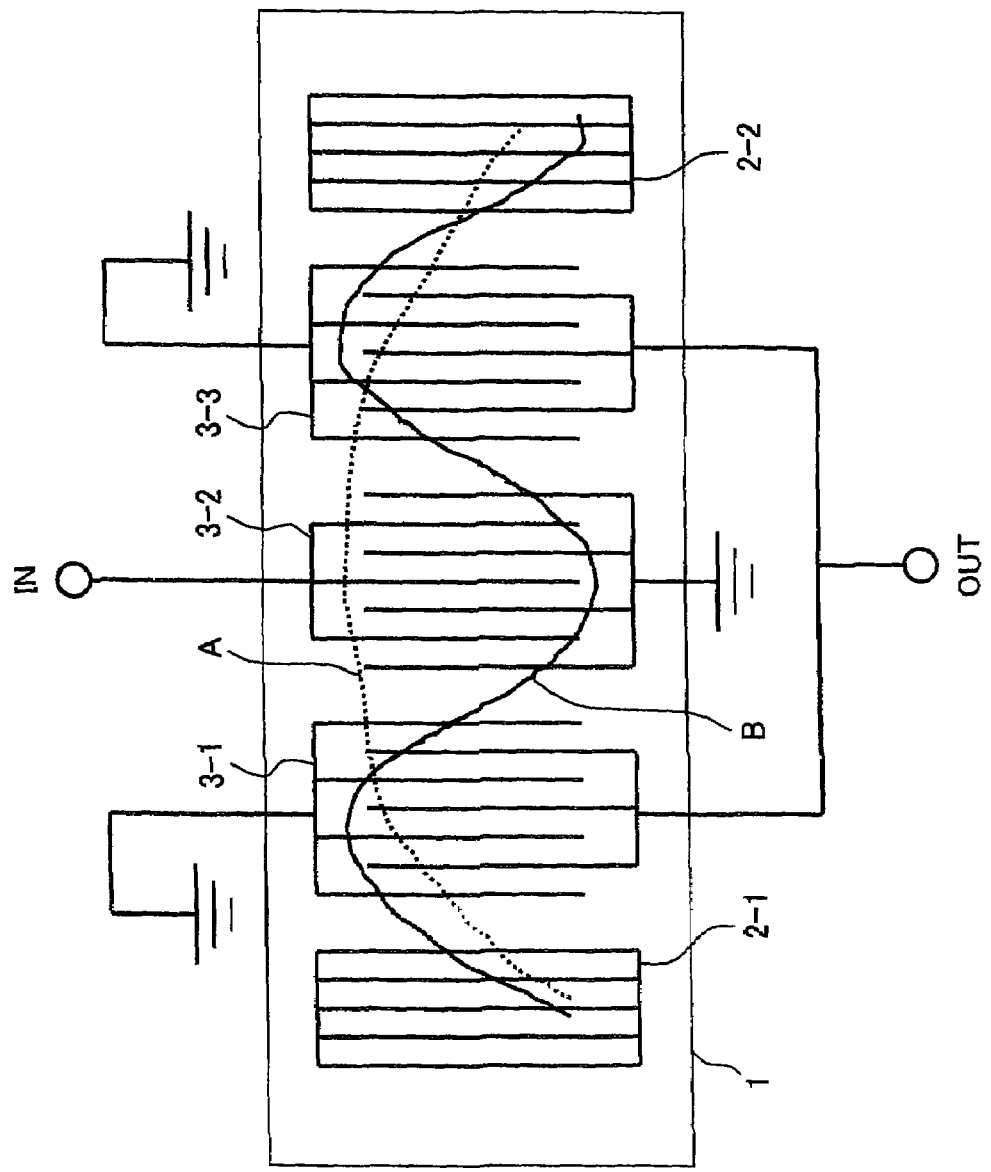
FIG. 1 shows a plan view of an exemplary structure of the conventional surface acoustic wave filter.

Also, in the above-mentioned embodiments of the present invention, the filter having the structure shown in FIG. 1 as a filter unit has been shown. However, the present invention may also be applicable to a surface acoustic wave filter structured of two stages, as shown in FIG. 2, or multi-stages more than two stages of a plurality of sets of the filter unit connected in cascade, in which the electrode pitches of the comb filters are adjusted on a filter unit basis.

Moreover, in the embodiments of the present invention shown in FIGS. 6 and 8, the electrode pitches of the center comb electrode 3-2 are fixed, while the electrode pitches of the neighboring comb electrode 3-1 (3-3) are adjusted. However, it may also be possible to structure in a reverse way, so that the electrode pitches of the center comb electrode 3-2 are adjusted, and the electrode pitches of the comb electrode 3-1 (3-3) are fixed.

Now, as a form of the surface acoustic wave filter, there has been a known method of connecting a surface acoustic wave (SAW) resonator in series to a multimode filter, thereby improving the attenuation characteristic.

Figure 11B:
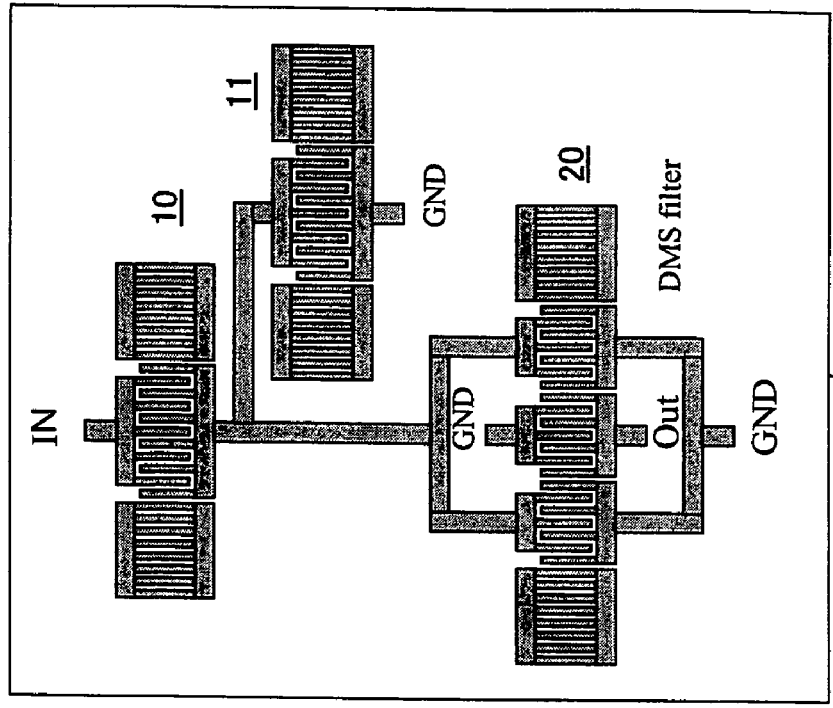
FIG. 11 shows an exemplary structure of the surface acoustic wave filter, in which a surface acoustic wave (SAW) resonator is connected in series with a multimode filter.

FIG. 11 shows an exemplary structure of the surface acoustic wave filter, in which the SAW resonator is connected in series to the multimode filter to obtain a wider bandwidth characteristic with reduced insertion loss in the overall filter.

Figure 11A:
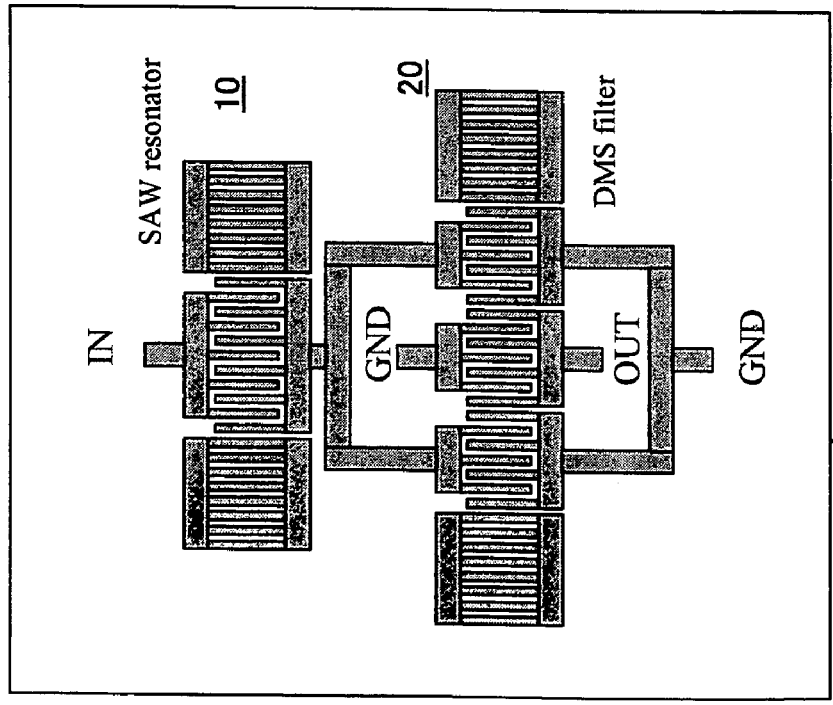

The structure shown in FIG. 11(A) includes a SAW resonator and electrodes constituting a multimode filter 20 on piezoelectric substrate 1, which are connected in series. In the example shown in FIG. 11(A), the SAW resonator 10 side constitutes an unbalanced input IN, and an unbalanced output is obtained from multimode filter 20. Here, it may also be possible to reverse the above-mentioned input and output relation.

In contrast to the structure shown in FIG. 11(A), a structure shown in FIG. 11 (B) additionally includes another SAW resonator 11 connected in parallel with SAW resonator 10. With this structure, it is possible to obtain a more preferable filter characteristic.

Figure 12:
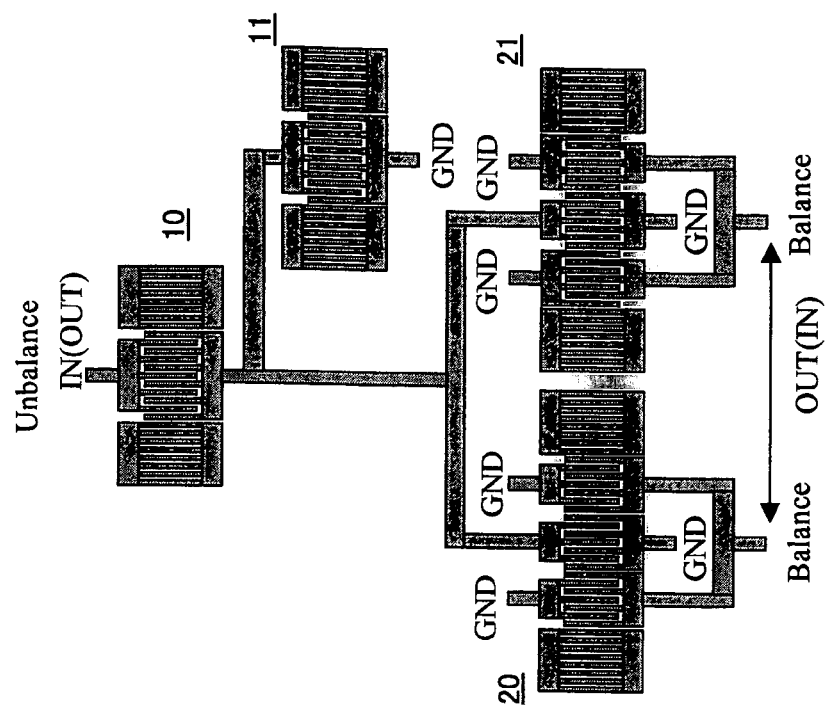
FIG. 12 shows an exemplary structure in which another multimode filter 21 is connected in parallel with multimode filter 20, in contrast to the filter structure shown in FIG. 11.
Figure 12:
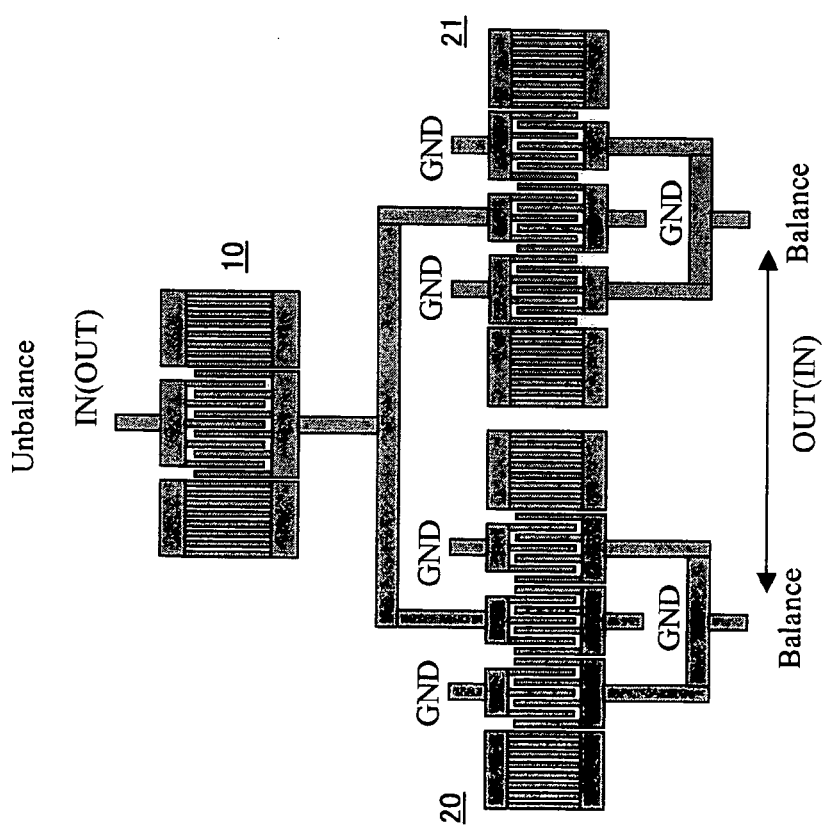

In FIG. 12, in contrast to the filter structures shown in FIGS. 11 (A) and (B), there is shown a still another structure additionally having a multimode filter 21 connected in parallel with multimode filter 20, though piezoelectric substrate 1 is not shown. In this structure shown in FIG. 12, it is possible to obtain balanced input or balanced output, which is advantageous in applying to a circuit requiring unbalance-to-balance conversion.

In the surface acoustic wave filter structured of SAW resonator 10 and multimode filters 20, 21 connected in series shown in FIGS. 11, 12, the present invention is applicable to these multimode filters 20, 21 each having the plurality of comb electrodes (three comb electrodes in FIGS. 11, 12).

Figure 13:
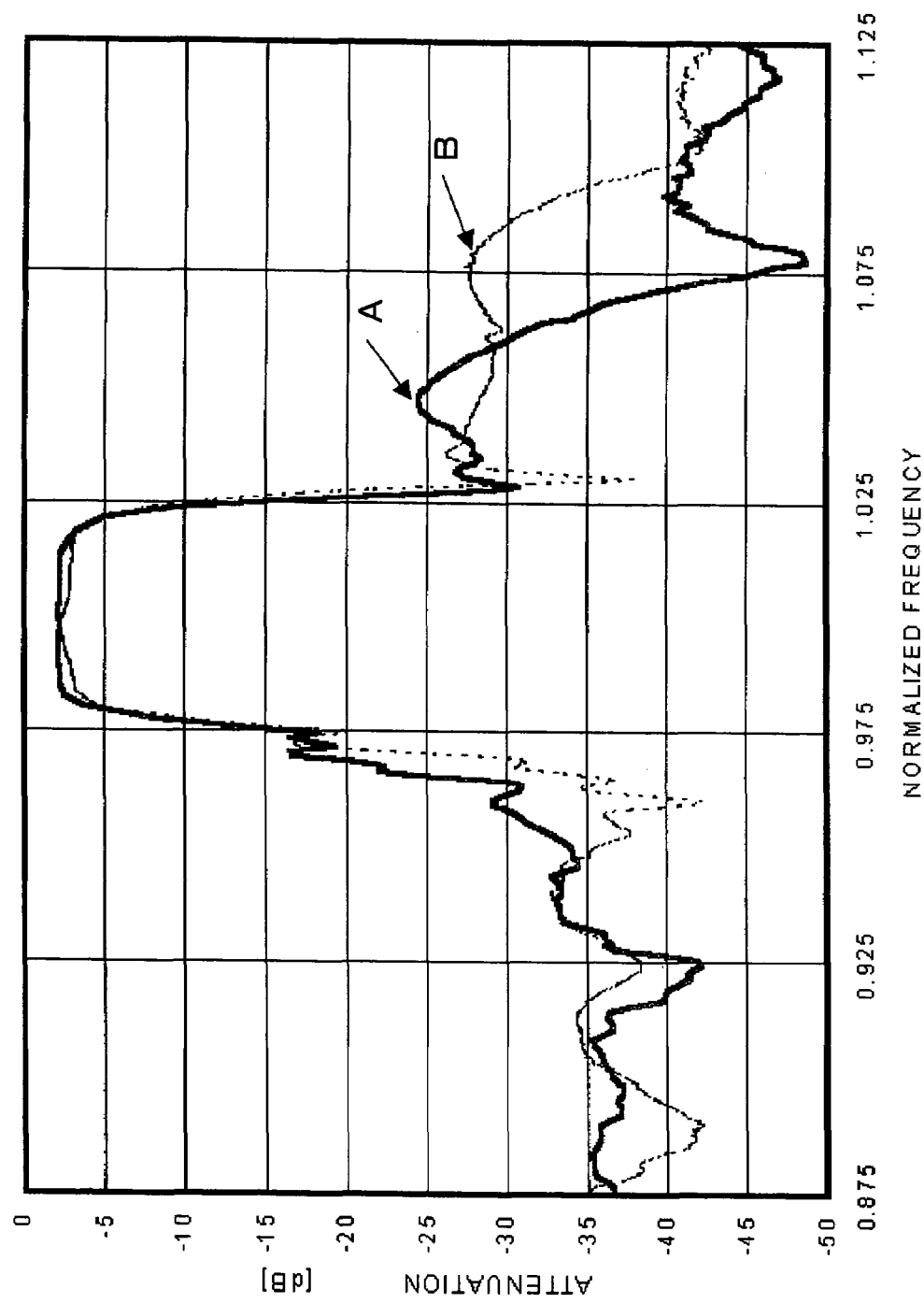
FIG. 13 shows a characteristic diagram of the surface acoustic wave filter in which the present invention is applied to each comb electrode of multimode filters 20, 21, in the structure shown in FIG. 12 (A).
Figure 14:
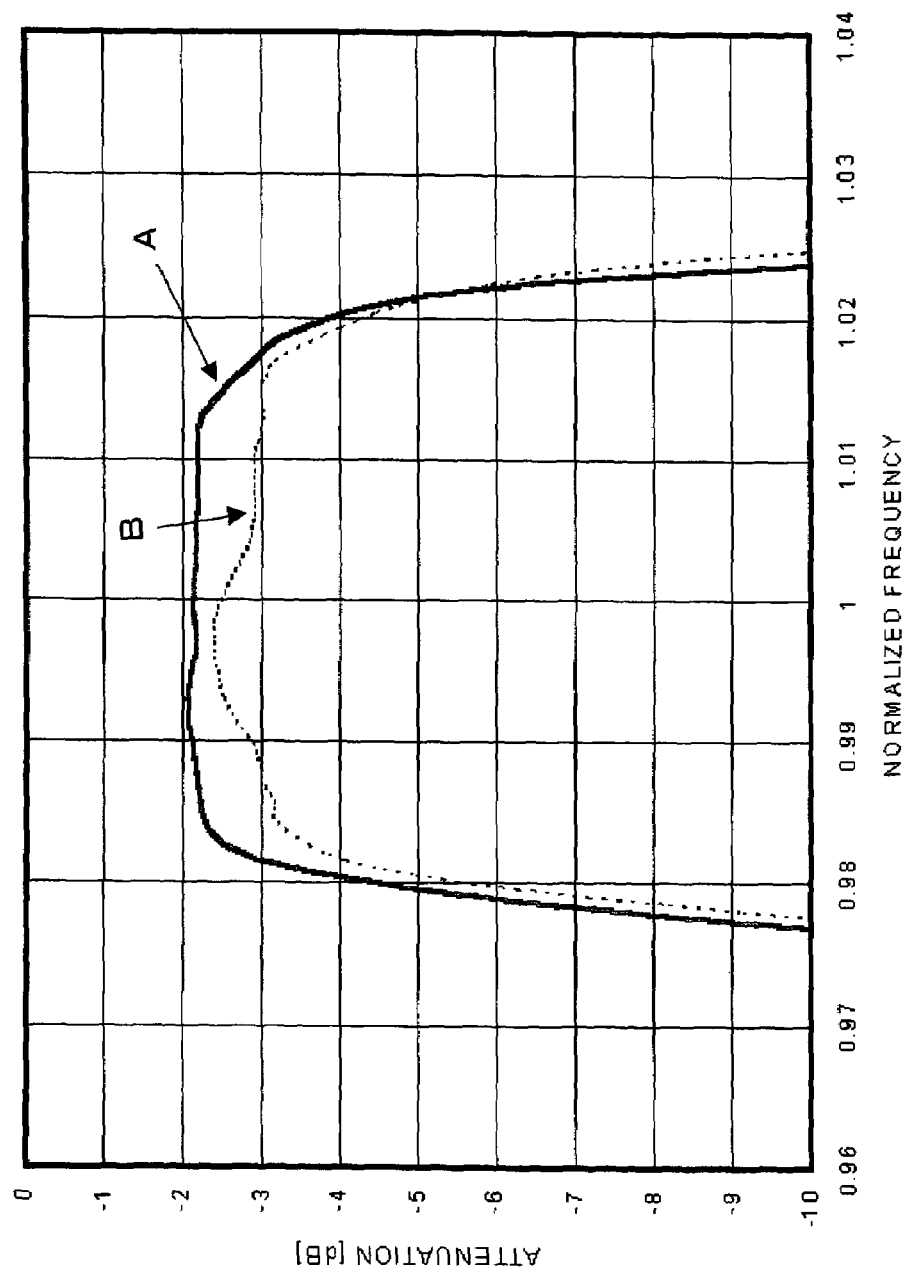
FIG. 14 shows an enlarged diagram illustrating a passband region in the characteristic diagram shown in FIG. 13.

FIGS. 13, 14 shows diagrams illustrating the characteristic (solid line A) of the surface acoustic wave filter having the structure shown in FIG. 12(B), in which the present invention is applied to the comb electrodes in each multimode filter 20, 21 to obtain a continuous surface acoustic wave phase between the comb electrode and the reflective electrode, together with diagrams illustrating, for comparison purpose, the characteristic (broken line B) of the conventional surface acoustic wave filter also having the structure shown in FIG. 12(B), whereas the present invention is not applied in the conventional surface acoustic wave filter, and accordingly discontinuity is produced in the surface acoustic wave phases between the comb electrodes and the reflective electrodes.

In FIGS. 13, 14, the horizontal axis shows normalized frequency, while the vertical axis shows attenuation. FIG. 14 is an enlarged diagram illustrating the passband region in the characteristic diagram shown in FIG. 13.

The surface acoustic wave filter in accordance with the present invention having the characteristic shown by the solid line A has the dimensions described below.

In the structure shown in FIG. 12 (B), multimode filters 20, 21 is structured of;

Left reflective electrode—three comb electrodes (IDT1-IDT2-IDT1)—right reflective electrode, which are placed in a row.

The numbers of comb electrode pairs of the left reflective electrode and the right reflective electrode are (52), respectively, and further, the numbers of the comb electrode pairs of the three comb electrodes are [(13-2-1.5)-(2-13.5-2)-(1.5-2-13)].

The electrode pitch of the left reflective electrode is 2.07 μm, and the electrode pitch of the right reflective electrode is 2.06 μm, and the electrode pitches of the three comb electrodes are (2.065-1.995-1.855)-(1.920-2.040-1.92)-(1.855-1.995-2.065) μm.

Also, the aperture length is 61 μm.

Further, the structure of SAW resonator 10 connected in series is (reflective electrode—IDT—reflective electrode), and the numbers of the electrode pairs are 50-105-50 pairs.

The electrode pitches are 2.007-2.007-2.007 μm, and the aperture length is 43 μm.

The structure of SAW resonator 11 connected in parallel is (reflective electrode—IDT—reflective electrode), and the numbers of the electrode pairs are 50-67-50 pairs.

The electrode pitches are 2.067-2.087-2.067 μm, and the aperture length is 55 μm.

Meanwhile, the conventional surface acoustic wave filter having the characteristic shown by the broken line B has the following dimensions:

In the structure shown in FIG. 12 (B), the number of electrode pairs and the electrode pitches of multimode filters 20, 21 are different from the those of the surface acoustic wave filter, in which the present invention is applied, having the characteristic shown by the solid line A.

In multimode filters 20, 21, the number of electrode pairs of the left reflective electrodes and the number of electrode pairs of the right reflective electrodes are (60), (40), respectively, and the numbers of the electrode pairs of the three comb electrodes are [(10.5)-(14.5)-(10.5)].

The electrode pitch of the left reflective electrode is 2.05 μm, and the electrode pitch of the right reflective electrode is 2.05 μm, and the electrode pitches of the three comb electrodes are 2.05-2.01-2.05 μm, and the aperture length is 60 μm.

Here, in the comparison of the characteristics shown by the solid line A and the broken line B in FIGS. 13, 14, the design values of the conventional surface acoustic wave filter having the characteristic shown by the broken line B is determined based on a premise of having a predetermined bandwidth. Further, the design values of the surface acoustic wave filter in which the present invention is applied, having the characteristic shown by the solid line A, is also determined based on a premise of having the same bandwidth as the above-mentioned predetermined bandwidth.

Accordingly, as described above, the numbers of the comb electrode pairs in multimode filters 20, 21 in the surface acoustic wave filter in which the present invention is applied, having the characteristic shown by the solid line A, are different from corresponding numbers in the conventional surface acoustic wave filter. It is to be understood that the present invention is applicable to a surface acoustic wave filter constituted of the series connection of a SAW resonator and multimode filters, and that the insertion loss can be reduced without damaging the sharp passband characteristic in this surface acoustic wave filter according to the present invention.

INDUSTRIAL APPLICABILITY

As the embodiments of the present invention have been described, it is possible to provide a surface acoustic wave filter in which both insertion loss and passband width are improved as compared to the conventional structure, by the use of the structure according to the present invention.

The foregoing description of the embodiments is not intended to limit the invention to the particular details of the examples illustrated, and all features and advantages of the invention which fall within the scope of the invention are covered by the appended claims.

What is claimed is:

1. A surface acoustic wave filter comprising:
a piezoelectric substrate;
an input comb electrode arranged on said piezoelectric substrate and formed from at least one input finger electrode and at least one first common finger electrode, the input finger electrode alternating with the first common finger electrode, the input finger electrode receiving an input signal, the first common finger electrode being connected to ground; and
an output comb electrode arranged on said piezoelectric substrate and formed from at least one output finger electrode and at least one second common finger electrode, the output finger electrode alternating with the second common finger electrode, the output finger electrode providing an output signal, the second common finger electrode being connected to ground, wherein
said surface acoustic wave filter is a longitudinally coupled mode surface acoustic filter and includes said input comb electrode and said output comb electrode disposed within a single propagation path in which a surface acoustic wave propagates,
said input comb electrode has a plurality of electrode fingers pitches,
said output comb electrode has a plurality of electrode fingers pitches, an electrode fingers pitch having the most pairs of electrode fingers
of said input comb electrode and an electrode fingers pitch having the most pairs of electrode fingers of said output comb electrode are different from each other,
the electrode fingers pitch having the most pairs of electrode fingers of said input comb electrode is larger than at least one of the plurality of electrode fingers pitches of said input comb electrode, and
said electrode fingers pitch having the most pairs of electrode fingers of said output comb electrode is larger than at least one of the plurality of electrode fingers pitches of said output comb electrode.

2. A surface acoustic wave filter of claim 1, wherein
said input comb electrode has electrode fingers spaced to define first and second electrode fingers pitches; and
said output comb electrode has electrode fingers spaced to define third and fourth pitches.

3. The surface acoustic wave filter of claim 2, wherein the first pitch is different from the second pitch, and the third pitch is different from the fourth pitch.

4. The surface acoustic wave filter of claim 3, wherein the second pitch is different from the fourth pitch.

5. A surface acoustic wave filter comprising:
a piezoelectric substrate;

an input comb electrode arranged on said piezoelectric substrate and formed from at least one input finger electrode and at least one first common finger electrode, the input finger electrode alternating with the first common finger electrode, the input finger electrode receiving an input signal, the first common finger electrode being connected to ground; and an output comb electrode arranged on said piezoelectric substrate and formed from at least one output finger electrode and at least one second common finger electrode, the output finger electrode alternating with the second common finger electrode, the output finger electrode providing an output signal, the second common finger electrode being connected to ground, wherein said surface acoustic wave filter is a longitudinally coupled mode surface acoustic filter and includes said input comb electrode and said output comb electrode disposed within a single propagation path in which a surface acoustic wave propagates, a pitch of electrode fingers of said input comb electrode and a pitch of electrode fingers of said output comb electrode are different from each other, one of said input comb electrode and said output comb electrode comprises a first comb electrode, the other of said input comb electrode and said output comb electrode comprises a second comb electrode, and a third comb electrode, said second comb electrode being placed on one side of said first comb electrode, said third comb electrode being placed on the other side of said first comb electrode, said first, second, and third comb electrodes are arranged along a direction in which a surface acoustic wave propagates, a plurality of multimode filters each having first, second, and third comb electrodes, and first and second reflector electrodes are formed on said piezoelectric substrate, and said plurality of multimode filters function as one filter in cooperation with each other; and each of said plurality of multimode filters is substantially identical in configuration to the others.

6. A surface acoustic wave filter comprising:

a piezoelectric substrate;

a first multimode filter having at least an input comb electrode arranged on said piezoelectric substrate, and at least an output comb electrode arranged on said piezoelectric substrate, a second multimode filter having at least an input comb electrode arranged on said piezoelectric substrate, and at least an output comb electrode arranged on said piezoelectric substrate, wherein each of said first and second multimode filters is longitudinally coupled and includes input and output comb electrodes disposed within a respective propagation path in which a surface acoustic wave propagates; and each input comb electrode has a first main pitch, the first main pitch is the pitch of the majority of electrode fingers forming a particular input comb electrode, each output comb electrode has a second main pitch, the second main pitch is the pitch of the majority of electrode fingers forming a particular output comb electrode, within each of said first and second multimode filters, each first main pitch is different in value from each second main pitch, and said first and second multimode filters are substantially identical in configuration to each other, and function as one filter in cooperation with each other.

7. A surface acoustic wave filter comprising:

a piezoelectric substrate;

a first multimode filter having (a) at least a first input comb electrode arranged on said piezoelectric substrate; and (b) at least a first output comb electrode arranged on said piezoelectric substrate, a second multimode filter having (a) at least a second input comb electrode arranged on said piezoelectric substrate, and (b) at least a second output comb electrode arranged on said piezoelectric substrate, wherein each of said first and second multimode filters is longitudinally coupled and includes input and output comb electrodes disposed within a respective propagation path in which a surface acoustic wave propagates, each said input comb electrode has a plurality of electrode fingers pitches, of the electrode fingers pitches of said input comb electrode, an electrode fingers pitch having the most pairs of electrode fingers is defined as a main input pitch, each said output comb electrode has a plurality of electrode fingers pitches, of the electrode fingers pitches of said output comb electrode, an electrode fingers pitch having the most pairs of electrode fingers is defined as a main output pitch, and wherein in each of said first and second multimode filters, the main pitch of electrode fingers of said input comb electrode and the main output pitch of electrode fingers of said output comb electrode are different from each other.

8. A surface acoustic wave filter comprising:

a piezoelectric substrate;

at least an input comb electrode arranged on said piezoelectric substrate, and at least an output comb electrode arranged on said piezoelectric substrate, wherein said surface acoustic wave filter is a longitudinally coupled mode surface acoustic filter and includes said input comb electrode and said output comb electrode disposed within a single propagation path in which a surface acoustic wave propagates, said input comb electrode has a plurality of electrode fingers pitches, said output comb electrode has a plurality of electrode fingers pitches, an electrode fingers pitch having the most pairs of electrode fingers, of said input comb electrode and an electrode fingers pitch having the most pairs of electrode fingers of said output comb electrode are different from each other, said electrode fingers pitch having the most pairs of electrode fingers of said input comb electrode is the largest of the plurality of electrode fingers pitches of said input comb electrode, and said electrode fingers pitch having the most pairs of electrode fingers of said output comb electrode is the largest of the plurality of electrode fingers pitches of said output comb electrode.

9. The surface acoustic wave filter of claim 8, wherein said input comb electrode has electrode fingers spaced to define first and second electrode fingers pitches; and said output comb electrode has electrode fingers spaced to define third and fourth pitches.

10. The surface acoustic wave filter of claim 9, wherein the first pitch is different from the second pitch, and the third pitch is different from the fourth pitch.

11. The surface acoustic wave filter of claim 10, wherein the second pitch is different from the fourth pitch.

12. A surface acoustic wave filter comprising:
a piezoelectric substrate;
at least an input comb electrode arranged on said piezoelectric substrate, and
at least an output comb electrode arranged on said piezoelectric substrate, wherein
said surface acoustic wave filter is a longitudinally coupled mode surface acoustic filter and includes said input comb electrode and said output comb electrode disposed within a single propagation path in which a surface acoustic wave propagates,
a pitch of electrode fingers of said input comb electrode and a pitch of electrode fingers of said output comb electrode are different from each other,
one of said input comb electrode and said output comb electrode comprises a first comb electrode including a pair of electrode fingers opposed to each other,
the other of said input comb electrode and said output comb electrode comprises a second comb electrode including a pair of electrode fingers opposed to each other, and a third comb electrode including a pair of electrode fingers opposed to each other, said second comb electrode being placed on one side of said first comb electrode, said third comb electrode being placed on the other side of said first comb electrode,
said first, second, and third comb electrodes are arranged along a direction in with a surface acoustic wave propagates, and wherein
a plurality of multimode filters each having first, second, and third comb electrodes, and first and second reflector electrodes are formed on said piezoelectric substrate, and said plurality of multimode filters function as one filter in cooperation with each other; and each of said plurality of multimode filters is substantially identical in configuration to the others.

* * * * *